United States Patent
Worledge et al.

(10) Patent No.: US 7,622,735 B2
(45) Date of Patent: Nov. 24, 2009

(54) WAFER FOR ELECTRICALLY CHARACTERIZING TUNNEL JUNCTION FILM STACKS WITH LITTLE OR NO PROCESSING

(75) Inventors: Daniel Christopher Worledge, Poughquag, NY (US); Philip Louis Trouilloud, Norwood, NJ (US); David William Abraham, Croton-on-Hudson, NY (US); Joerg Dietrich Schmid, Hopewell Junction, NY (US)

(73) Assignee: International Business Machines Corporation, Armonk, NY (US)

( * ) Notice: Subject to any disclaimer, the term of this patent is extended or adjusted under 35 U.S.C. 154(b) by 413 days.

(21) Appl. No.: 11/119,665

(22) Filed: May 2, 2005

(65) Prior Publication Data

US 2009/0261820 A1 Oct. 22, 2009

Related U.S. Application Data

(62) Division of application No. 10/244,766, filed on Sep. 16, 2002, now Pat. No. 6,927,569.

(51) Int. Cl.
*H01L 21/66* (2006.01)

(52) U.S. Cl. .................. 257/48; 257/421; 257/E21.524; 257/E21.665; 257/E27.006

(58) Field of Classification Search .................... 257/48, 257/421, E21.524, E21.665, E27.006
See application file for complete search history.

(56) References Cited

U.S. PATENT DOCUMENTS

| | | | |
|---|---|---|---|
| 5,475,304 A | 12/1995 | Prinz | 324/207.21 |
| 5,721,488 A | 2/1998 | Sakai et al. | 324/210 |
| 5,854,554 A | 12/1998 | Tomita et al. | 324/210 |
| 6,111,784 A * | 8/2000 | Nishimura | 365/173 |
| 8,219,213 | 4/2001 | Goto et al. | 360/79 |
| 6,294,911 B1 | 9/2001 | Shimazawa et al. | 324/210 |
| 6,381,107 B1 | 4/2002 | Redon et al. | 360/324.2 |
| 6,538,430 B2 | 3/2003 | Carrington et al. | 324/210 |
| 6,552,554 B1 * | 4/2003 | Prinz et al. | 324/719 |
| 6,657,431 B2 | 12/2003 | Xiao | 324/244 |
| 2008/0164872 A1 * | 7/2008 | Worledge | 324/230 |

OTHER PUBLICATIONS

Capers The microscopic four point probe Webpage date May 2001.

* cited by examiner

*Primary Examiner*—Anh Phung
*Assistant Examiner*—Michael Lulis
(74) *Attorney, Agent, or Firm*—Ryan, Mason & Lewis, LLP

(57) ABSTRACT

Probes are electrically connected to a surface of a tunnel junction film stack comprising a free layer, a tunnel barrier, and a pinned layer. Resistances are determined for a variety of probe spacings and for a number of magnetizations of one of the layers of the stack. The probe spacings are a distance from a length scale, which is related to the Resistance-Area (RA) product of the tunnel junction film stack. Spacings from as small as possible to about 40 times the length scale are used. Beneficially, the smallest spacing between probes used during a resistance measurement is under 100 microns. A measured in-plane MagnetoResistance (MR) curve is determined from the "high" and "low" resistances that occur at the two magnetizations of this layer. The RA product, resistances per square of the free and pinned layers, and perpendicular MR are determined through curve fitting.

3 Claims, 10 Drawing Sheets

Rf=18.8Ω   Rp=40.4Ω   RA=71934 Ω-μm²   MR=23.4%

WAFER FOR ELECTRICALLY CHARACTERIZING TUNNEL JUNCTION FILM STACKS WITH LITTLE OR NO PROCESSING

PRIORITY INFORMATION

The instant application claims priority under 35 U.S.C. §121 as a division of U.S. application Ser. No. 10/244,766, filed Sep. 16, 2002 now U.S. Pat. No. 6,927,569, which is incorporated by reference herein.

STATEMENT OF GOVERNMENT RIGHTS

This invention was made with Government support under grant contract number MDA972-99-C-0009 awarded by the Defense Advanced Research Projects Agency (DARPA) of the United States Department of Defense. The Government has certain rights in this invention.

FIELD OF THE INVENTION

This invention relates to tunnel junction devices and, more specifically, the invention relates to electrically characterizing tunnel junction film stacks.

BACKGROUND OF THE INVENTION

Conventional techniques for characterizing tunnel junction film stacks require extensive processing of a semiconductor wafer in order to measure a few characteristics of the tunnel junction film stack. This processing is time consuming, complex, and can ruin devices created via processing. Additionally, even if processing creates suitable devices for test, it is unclear whether measurements have been influenced by the processing. In other words, it is unclear as to whether the measurements are a function of the tunnel junction film stack, the processing that creates additional structures needed to measure characteristics of the tunnel junction film stack, the additional structures, or some combination of these.

Consequently, a need exists for characterizing tunnel junction films without time consuming and expensive processing that is fraught with accompanying flaws.

SUMMARY OF THE INVENTION

Aspects of the present invention overcome problems of the prior art by providing techniques to characterize tunnel junction film stacks with minor or no processing. In one aspect of the invention, resistances are determined for a variety of probe spacings. Probes are electrically connected to a surface of a tunnel junction film stack. Generally, a tunnel junction film stack comprises a free layer, a tunnel barrier, and a pinned layer, but many other configurations are possible. The electrical connection can be a physical connection directly to the surface of the tunnel junction film stack or an electrical connection to a contact pad that is physically attached to the surface of the tunnel junction film stack. The probe spacings are generally selected to be within a predetermined distance from a length scale, which is related to the Resistance-Area (RA) product of the tunnel junction film stack. While other spacings may be used, resistances, depending on probe or contact pad configurations, tend to stabilize after probe or contact pad spacing reaches a certain distance from the length scale. For instance, probe spacings greater than 40 times the length scale generally yield very similar resistances. The resistances are measured for both magnetizations of one of the layers of the stack, such that sets of "high" and "low" resistances are determined for both magnetizations of the free layer. Generally, the free layer is the layer able to have multiple magnetizations. Additionally, an in-plane MagnetoResistance (MR) curve can be determined from the high and low resistances that occur at the two multiple magnetizations of the free layer.

In another aspect of the invention, the RA product, perpendicular MR, and resistances per square of the free layer, $R_F$, and of the pinned layer, $R_P$, are determined through a curve fitting technique. While a number of curve fitting techniques may be used to determine these quantities, a suitable technique is as follows. The in-plane MR is determined from the measured high and low resistances using a standard formula. The in-plane MR and one or both of the resistances are simultaneously fit to theoretical values of in-plane MR and resistance. This is done by assuming values for the RA product, $R_F$, $R_P$, and perpendicular MR and then calculating in-plane MR and resistance curves. The values of the in-plane MR and resistance curves are then compared with the calculated values of in-plane MR and resistance curves. This process is then iterated, each time changing values for the RA product, $R_F$, $R_P$, and perpendicular MR, until the best agreement between the measured and calculated values of in-plane MR and resistance is obtained.

In another aspect of the invention, an apparatus is provided for characterizing tunnel junction film stacks. The apparatus comprises a magnetic field generator used to generate a magnetic field, a micro-machined multi-point probe having four or more probes, where the smallest spacing between any two of the multiple probes used during a resistance measurement has a spacing of 100 microns or less, and a resistance measuring module coupled to the multi-point probe and adapted to measure resistance. The magnetic field is generated to place a semiconductor wafer having a tunnel junction film stack into one of a plurality of magnetizations for the tunnel junction film stack. A resistance measurement by the resistance module at this magnetization at least partially characterizes the tunnel junction film stack. Additionally, various probes and contact pad configurations are described that are suitable for use with the apparatus. Advantageously, a multi-point probe is described that allows many different voltage measurements to be taken very quickly. When using the multi-point probe, the apparatus further comprises a multiplexer used to couple probes to the resistance measuring module. Probe spacings are generally selected to be within a predetermined distance from a length scale, which is related to the RA product of a tunnel junction film stack being measured.

A more complete understanding of the present invention, as well as further features and advantages of the present invention, will be obtained by reference to the following detailed description and drawings.

DETAILED DESCRIPTION OF PREFERRED EMBODIMENTS

The present invention overcomes limitations of conventional techniques because little or no processing of a semiconductor wafer having a tunnel junction film stack formed thereon is necessary to characterize the tunnel junction film stack. The present invention uses probes or contact pads in particular configurations to characterize tunnel junction film stacks. Resistance is determined by using the probes, contact pads, or both, and by using current and voltage through known resistance-measuring techniques. The resistance is measured for a particular magnetization of a free layer and certain spacing or spacings between probes or contact pads. The free layer is magnetized with a different magnetization, and another resistance is determined. One of the previously determined resistances is a high resistance, and one is a low resistance. Using these two determined resistances, an in-plane MagnetoResistance (MR) may be determined. This process is repeated for a number of probe or contact pad spacings. An in-plane MR curve and two resistance curves, one for each of the high and low resistances, can be determined from the measured data. Using these curves, values are determined through curve fitting techniques for resistance per square of the free layer ($R_F$), resistance per square of the pinned layer ($R_P$), the Resistance-Area (RA) product of the stack, and the perpendicular MR.

For ease of reference, this disclosure is divided into three sections: (1) the INTRODUCTION section describes why commonly held beliefs about the inability to characterize tunnel junction stacks by using probes or contact pads are incorrect, and gives a simple description of aspects of the present invention; (2) the EXEMPLARY THEORY AND METHOD section describes a method suitable for characterizing tunnel junction stacks with probes or contact pads and describes theory that explains measured results; and (3) the EXEMPLARY APPARATUS section describes apparatus suitable for use with the present invention.

INTRODUCTION

Figure 1A:
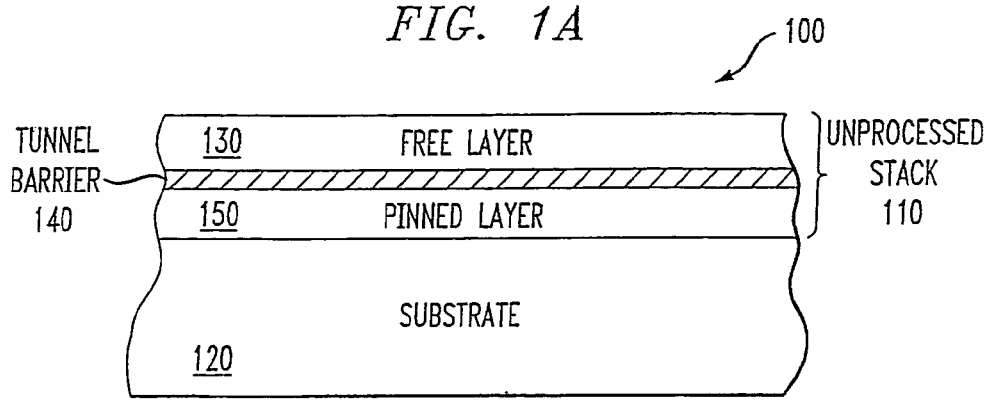
FIG. 1A is a side view of an unprocessed semiconductor wafer having a tunnel junction film stack formed thereon.

A tunnel junction film stack is a series of films formed on top of each other. A tunnel junction film stack is used to create a tunnel junction device, to be described in more detail below. An unprocessed semiconductor wafer 100 is shown in FIG. 1A. Unprocessed semiconductor wafer 100 comprises an unprocessed tunnel junction stack 110 formed on a substrate 120. Unprocessed tunnel junction stack 110 comprises a free layer 130, a tunnel barrier 140, and a pinned layer 150. The layers comprising unprocessed stack 110 are often called "films," and the stack itself is often called a "film stack." Conventional characterization techniques for tunnel junction film stacks do not allow characterization of the unprocessed tunnel junction film stack 110. Aspects of the present invention, as described below, do allow characterization of unprocessed tunnel junction film stack 110. An unprocessed tunnel junction film stack 110 is primarily used to create a "tunnel junction," after a generally extensive amount of processing.

Figure 1B:
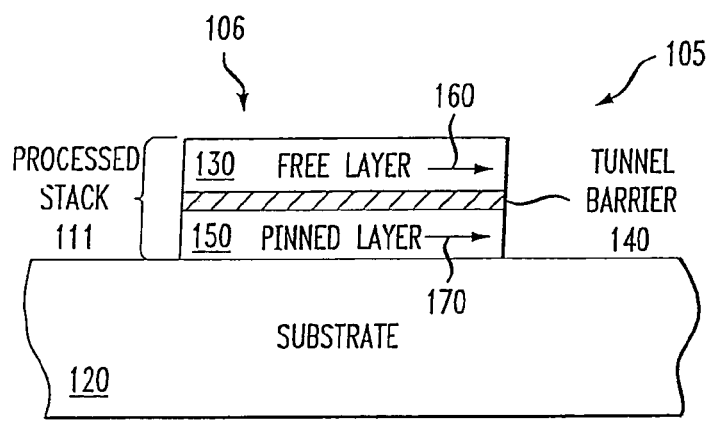
FIGS. 1B and 1C are side views of the semiconductor wafer of FIG. 1A, after some amount of processing has been performed.
Figure 1C:
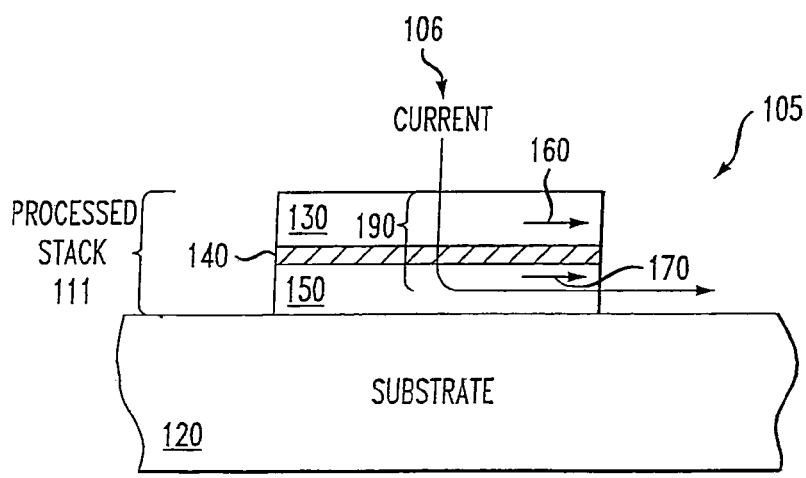

A tunnel junction is a device where carriers, generally electrons, are made to "tunnel" through a tunnel barrier. Diagrams of a simple tunnel junction device 106 are shown in FIGS. 1B and 1C. These figures show a processed semiconductor wafer 105 with a tunnel junction device 106 formed thereon. Tunnel junction device 106 is formed by forming a tunnel junction stack 110 on a substrate 120 (as shown in FIG. 1A), and patterning the unprocessed stack 110 to form the tunnel junction device 106 and a processed stack 111. Tunnel junction device 106 comprises, as described above, a free layer 130, a tunnel barrier 140, and a pinned layer 150. It should be noted that FIGS. 1B and 1C are used solely to illustrate certain terms and to provide an introduction to tunnel junction films. Actual tunnel junction devices used, for instance, in a Magnetic Random Access Memory (MRAM) device will be much more complex than tunnel junction device 106.

The pinned layer 150 is named as such because its magnetization 170 is pinned such that it "points" in a certain direction, as shown in FIGS. 1B and 1C. The free layer 130, conversely, is named as such because its magnetization 160 can be changed via a magnetic field that is a applied for a predetermined time. In FIG. 1B, the magnetization 160 of the free layer 130 "points" to the right; in FIG. 1C, the magnetization 160 "points" to the left. The "pointing" of the magnetizations 160, 170 is a visualization of the polarity of the magnetizations 160, 170. The magnetization 160 of the free layer 130 will remain pointing in the direction caused by the magnetic field, even after the field is removed. The magnetization 160 can be flipped in the other direction by applying a magnetic field in the opposite direction.

FIG. 1C illustrates how tunnel junction device 106 is used in devices such as an MRAM. Current is forced through the free layer 130. The tunnel barrier 140 impedes flow of the current, but some electrons will tunnel through the tunnel barrier 140. These electrons then pass through the pinned layer 150, where they are then extracted through conductive vias (not shown) that contact the pinned layer 150.

Because the current is known, the voltage between where the current enters and where it leaves provides an indication of the resistance between the entry and exit points. This resistance changes depending on magnetizations 160, 170: the parallel magnetization, shown in FIG. 1B, and the anti-parallel magnetization, shown in FIG. 1C, yield different resistances. Generally, the anti-parallel resistance is higher than the parallel resistance, but this depends on the materials used in the free layer 130 and pinned layer 150. Thus, determining the voltage for a particular current passing through the tunnel junction device 106 provides an effective technique for determining the state of magnetizations 160, 170.

The resistance measured by current that passes perpendicular, as illustrated by reference 190, to the surface 135 of an unprocessed stack 110 or processed stack 111 is quantified by a Resistance-Area (RA) product. The RA product changes when the magnetization 160 is changed.

Figure 2:
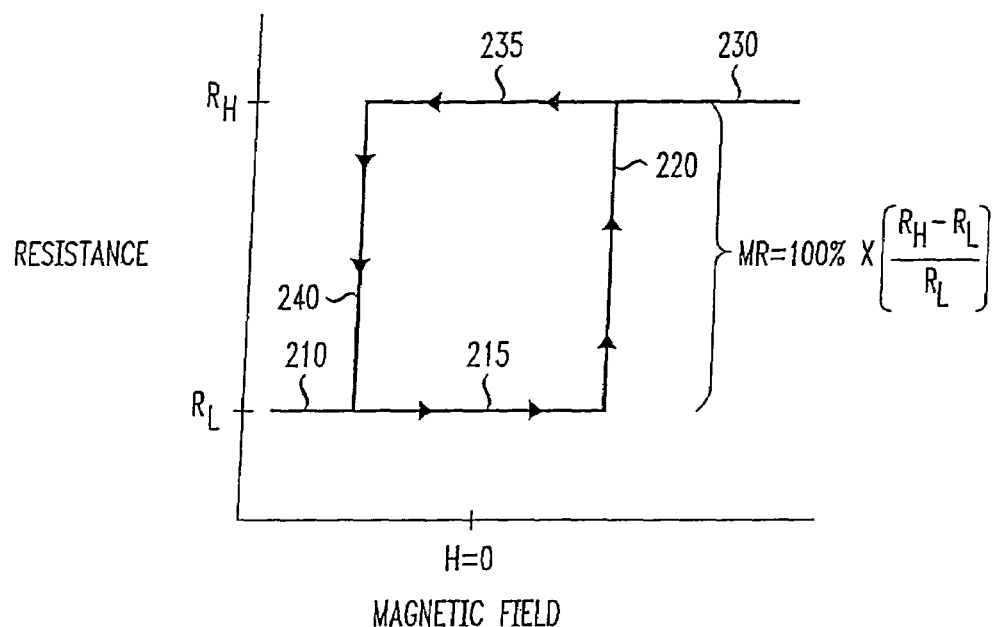
FIG. 2 is a graph of a hysteresis curve used to explain how many tunnel junction devices operate.

FIG. 2 illustrates another quantity that researchers would like to quantify for tunnel junction stacks, which is the MagnetoResistance (MR). FIG. 2 shows a hysteresis curve having four distinct paths. The hysteresis curve shown in FIG. 2 is used to illustrate how many tunnel junction devices operate. When the applied magnetic field has a negative value, the magnetization of the free layer 130 (see FIG. 1) will be a first magnetization. This is illustrated by the path 210, where the resistance of the unprocessed stack 110 (see FIG. 1A) or processed stack 111 (see FIGS. 1B and 1C) is indicated as a low resistance. As the magnetic field is increased, the resistance will stay low, traveling along path 220. At some particular positive magnetic field, the resistance suddenly jumps to the high resistance. This occurs because the magnetization of the free layer 130 has become a second magnetization. As magnetic field is increased, path 230 will be followed. As magnetic field is decreased, path 240 is followed, at the high resistance. As the magnetic field is further decreased until some negative value, the resistance suddenly changes to the low resistance again, as the free layer 130 is magnetized back to the first magnetization. The MR is then related to the difference between the high and low values of resistance, as shown in the following formula:

$$MR = 100\% \times \left(\frac{R_H - R_L}{R_L}\right).$$

This MR will be called a "perpendicular" MR herein in order to distinguish it from measured and calculated values of "in-plane" MR used to define MR curves. It should be noted that, when the magnetic field is removed, a tunnel junction device will be at one of two magnetizations, either magnetization 215 or 235.

Thus, there are multiple quantities that a researcher would like to characterize in order to determine the best materials, thicknesses, and processing procedures for the unprocessed stack 110, as shown in FIG. 1A. However, current technology means that it is necessary to process the unprocessed stack 110 to make a small, well defined tunnel junction device with external leads connected to top and bottom films of the unprocessed stack 110. This processing involves extensive lithography, etching, dielectric deposition, and metal deposition, and therefore is expensive and time consuming. Moreover, the processing often introduces flaws into the tunnel junction device, which, during testing, are impossible to separate from flaws in the unprocessed stack 110.

Even when conventional techniques are used for creating tunnel junction devices suitable for measuring the RA product, the resistance per square of the free layer and pinned layer, $R_F$ and $R_P$, respectively, cannot be determined. The resistance per square of a layer is the resistance a current experiences as it flows through the layer, parallel to upper and lower surfaces of the layer. The resistances $R_F$ and $R_P$ are quantities that it would be beneficial to measure but that cannot be measured through conventional techniques used to measure the RA product.

Moreover, it was previously believed that MR and other quantities could not be measured by using probes or contact pads in electrical connection with the surface of a tunnel junction film of a tunnel junction film stack (generally called a "stack" herein for simplicity). A tunnel junction film stack is any stack having one or more tunnel barriers sandwiched between two or more other films. In this disclosure, a "probe" is a device that is not affixed to the surface being measured, while a "contact pad" is affixed to the surface being measured. A probe can be affixed to an intermediate metal structure, such as a contact pad. Electric coupling of the probe to the tunnel junction film stack can occur through physical contact between the probe and the surface of the tunnel junction film stack, through a probe that is affixed to an intermediate metal structure, or through other techniques known to those skilled in the art.

Figure 3:
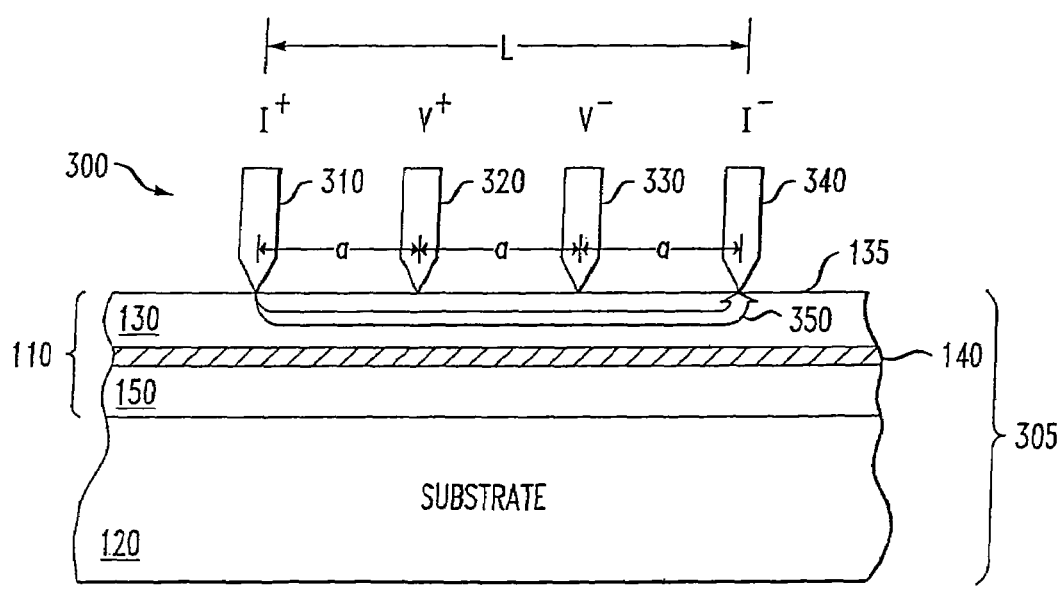
FIG. 3 is a side view of a four-point probe that is being used to measure characteristics of an unprocessed semiconductor wafer having a tunnel junction stack formed thereon.

FIG. 3 shows an example of one potential technique some researchers have used to attempt to measure MR and resistance of tunnel junction films. A portion 305 of a semiconductor wafer is shown. Portion 305 comprises a substrate 120 and an unprocessed stack 110 having a number of tunnel junction films. The tunnel junction films, as in FIGS. 1A and 1B, comprise the free layer 130, tunnel barrier 140, and pinned layer 150. A four-point probe 310 is used to attempt to determine MR and resistance, for instance. The four-point probe 300 comprising probes 310, 320, 330, and 340, each separated by a distance, a, so that the entire distance from start to end of the four-point probe 300 is L. Typical conventional four-point probes have an L of 1.5 to 3 millimeters (mm). Each probe 310 through 340 contacts top surface 135 of free layer 130. Probe 310 is used to inject current, and probe 340 is used to collect the current after it passes through the unprocessed stack 110. Probes 320 and 330 are used to measure voltage.

The four-point probe 300 is a well known tool used to characterize many different types of semiconductors and other materials. In fact, it is used to characterize Giant MagnetoResistive (GMR) films, which are used in read and write heads of many current hard drives. In GMR, the tunnel barrier 140 is replaced by a metal, which allows current to flow to the pinned layer 150.

However, for tunnel junction devices, conventional thought was that the current could not pass through the tunnel barrier 140. The current, it was assumed, passed through path 350 and never into the pinned layer 150. Consequently, the RA product of the tunnel junction barrier 140 could not be determined, as the current never passes through pinned layer 150. Because of this, the MR cannot be determined, as current must flow through tunnel junction barrier 140 in order to determine MR. Moreover, when a four-point probe 300 was used to attempt to measure MR, the measured MR would be very low, as shown below. Ironically this was because the current flowed through both the free and pinned layers (and so did pass through the barrier) but the contribution of the barrier to the resistance was negligibley small. Therefore, any researcher using commonly available probes (such as four-point probe 300) to attempt to characterize tunnel junction films would determine no suitable data. Additionally, while resistance can be measured with a four-point probe 300, it was previously believed that the measured resistance was not useful.

What the researchers did not realize, and what is part of the present invention, is that the optimum probe spacing is related to the RA product and the resistance per square of the free and pinned layers ($R_F$ and $R_P$, respectively) of the unprocessed stack 110. As developed more fully below, spacing between probes must be near a length scale, defined herein as follows:

$$\lambda = \left(\frac{RA}{R_F + R_P}\right)^{\frac{1}{2}},$$

where $\lambda$ is the length scale, RA is the RA product of the unprocessed stack 110 or processed stack 111, $R_F$ is the resistance/square of the free layer 130, and $R_P$ is the resistance/square of the pinned layer 150. For instance, for a tunnel junction stack having an RA product of 1,000 Ohm-square microns and assuming that the $R_F$ and $R_P$ resistances per square of each about 10 Ohms, the length scale shown above indicates that probe spacing should be within some distance of 7 microns. Conventional probes are much, much larger than this probe spacing, typically 100 times larger. Additionally, to determine the perpendicular MR, RA product, and $R_F$ and $R_P$, it is important that multiple resistance measurements be made, using different probe spacings, for both high and low resistances caused by the magnetization of the free layer 130. These multiple measurements allow in-plane MR and resistance to be determined at multiple probe spacings. The perpendicular MR that is to be measured, the RA product, the $R_F$, and the $R_P$ can all be determined by using curve fitting techniques. Moreover, the present invention allows these measurements to be taken with little or no processing of the stack. In this disclosure, a semiconductor wafer having a tunnel junction film stack formed thereon is considered to be unprocessed. Using the present invention, the problems associated with creating an actual tunnel junction device before being able to characterize the tunnel junction film stack are dramatically reduced or completely eliminated.

The theory behind aspects of the present invention is described below. Before describing theory, it is beneficial to describe a rudimentary model that comes close to theory and to show some figures that illustrate why conventional probes do not measure suitable quantities for tunnel junction film stacks.

Figure 4A:
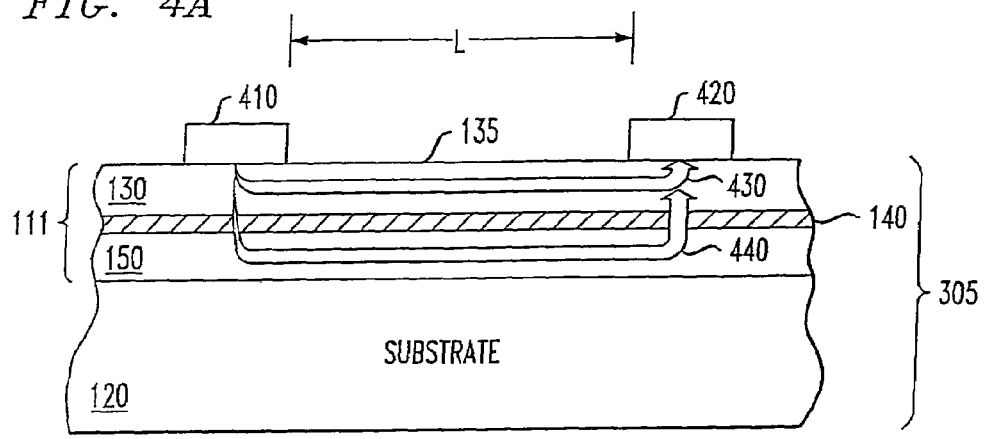
FIG. 4A is a side view of a processed semiconductor wafer having a tunnel junction stack formed thereon and two contact pads, in accordance with one embodiment of the present invention.
Figure 4B:
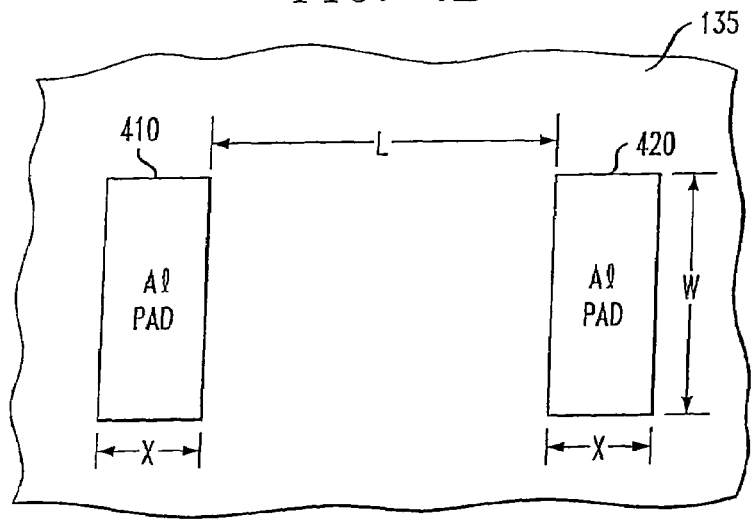
FIG. 4B is a top view of the processed semiconductor wafer of FIG. 4A.

Referring now to FIG. 4A, a side view of a semiconductor wafer 305 is shown. A processed stack 111 and substrate 120 structure are shown. However, two lithographically defined contact pads 410 and 420, formed on the surface 135 of free layer 130, are shown. Current is injected into contact pad 410 and collected at contact pad 420. Voltage is measured across contact pads 410 and 420. As shown in FIG. 4A, current flows through paths 430 and 440. In FIG. 4B, a top view of the contact pads 410 and 420 is shown. Each is made of a metal, such as aluminum, deposited on the surface 135 of free layer 420 through techniques known to those skilled in the art. The contact pads 410, 420 are separated by a distance, L, and each has a width, W, and length, X. It is assumed that W>>L>>X.

Figure 4C:
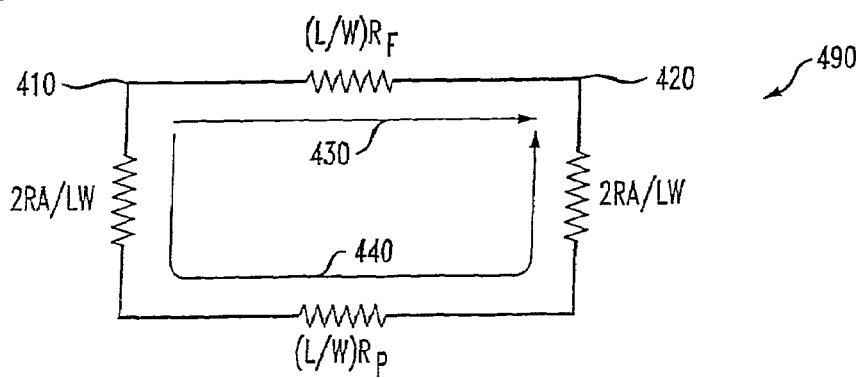
FIG. 4C is a representation of a "toy model" used to explain aspects of the present invention, in accordance with one embodiment of the present invention.

FIG. 4C shows a "toy model" of a resistor network. The toy model 490 is a simple, approximate, illustration of the resistances encountered by the current as it travels through paths 430, 440. As current travels through path 430, it experiences a resistance equal to approximately $(L/W)R_F$. As current travels through path 430, it experiences multiple resistances.

As the current in path 440 travels from contact pad 410 through the processed stack 111, it experiences a resistance of approximately 2RA/LW, because the RA product is a measure of "vertical" resistance of the processed stack 111 and the current passes through an area of approximately WL/2. As the current in path 440 travels through the pinned layer 150, it experiences a resistance of about $(L/W)R_P$. As the current travels back up through processed stack 111 to contact pad 420, it again experiences a resistance of 2RA/LW.

While a predetermined current is forced through the contact pads 410, 420, voltage is measured. The measured voltage allows a measured resistance to be determined for the particular contact spacing, L. This step measures one of $R_H$ or $R_L$, depending on the magnetization of the free layer 130. A magnetic field is applied to cause the magnetization of the free layer 130 to point in a different direction, then current is again forced through the contact pads 410, 420, and the resultant voltage is measured. Because $R_H$ and $R_L$ are known, an in-plane MR may be determined. This process is repeated for many different contact spacings, L. Measured resistances and in-plane MR may be plotted, as shown in FIGS. 5A and 5B.

Figure 5A:
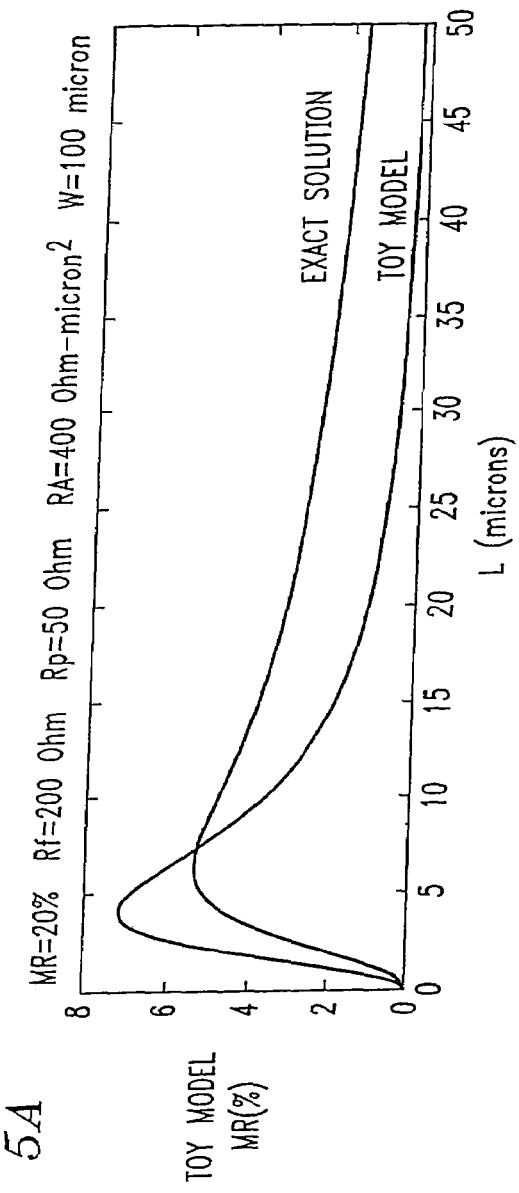
FIGS. 5A and 5B are graphs of in-plane MagnetoResistance (MR) and resistance, respectively, for the toy model of FIG. 4C and exact solutions for the configuration of FIGS. 4A and 4B.
Figure 5B:
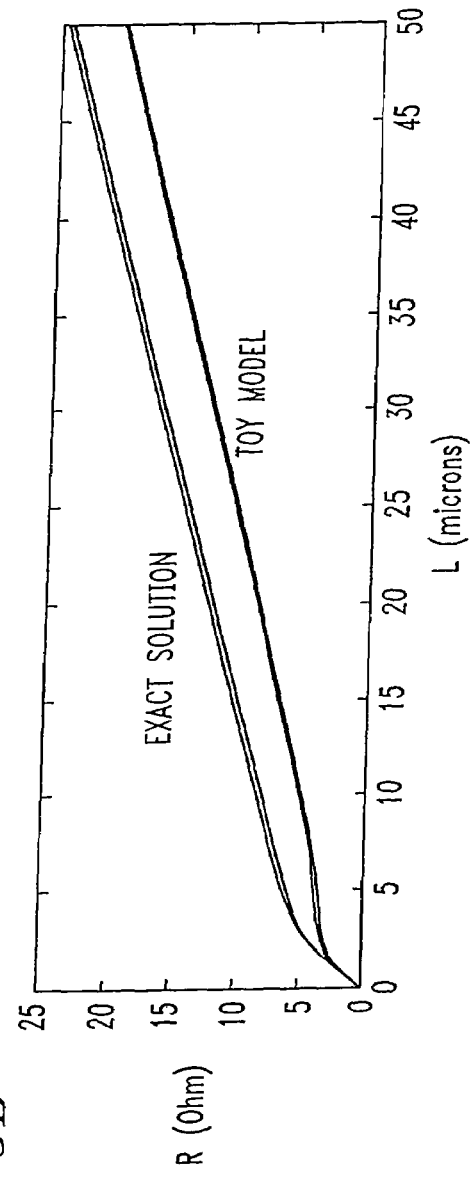

FIG. 5A shows a plot of in-plane MR versus contact pad spacing, L, for both the toy model 490 and an exact solution (described in more detail below) for this contact pad configuration. FIG. 5B shows a plot of measured resistances, both $R_H$ and $R_L$, versus contact pad spacing, L, for both the toy model 490 and the exact solution. What FIGS. 5A and 5B show is that the toy model 490 is a relatively close approximation to theory. Additionally, both the toy model and the exact solution show that it is possible to characterize a tunnel junction stack by using contact pads, but that the contact pads must be within a predetermined distance in order to be able to extract suitable quantities from the data. In particular, as FIG. 5A shows, the perpendicular MR (20 percent), $R_F$ (200 Ohm), $R_P$ (50 Ohm), and RA product (400 Ohm-micron$^2$) can all be extracted by using the in-plane MR and measured resistances curves. Suggested methods for extracting these quantities are given below.

Figure 6A:
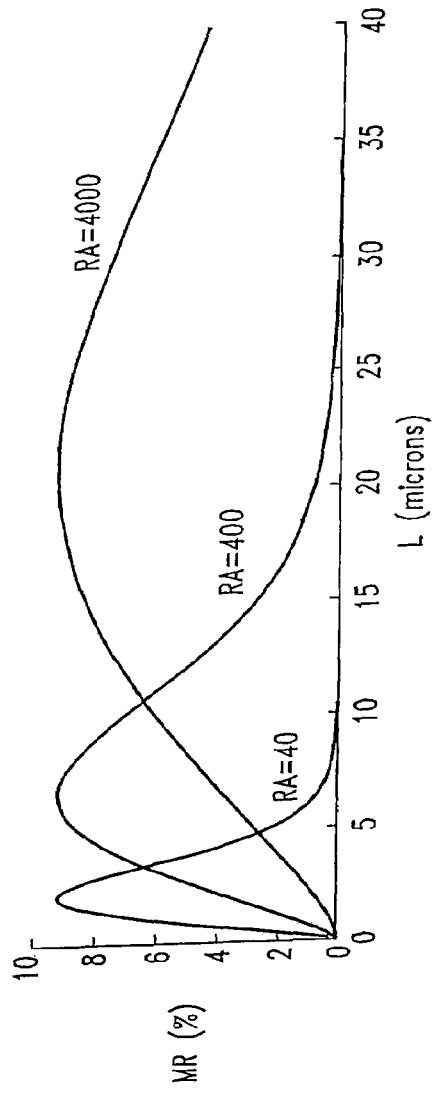
FIGS. 6A and 6B are graphs of in-plane MR and resistance, respectively, for multiple Resistance-Area (RA) products of tunnel junction film stacks using a four-point probe configuration, in accordance with one embodiment of the present invention.
Figure 6B:
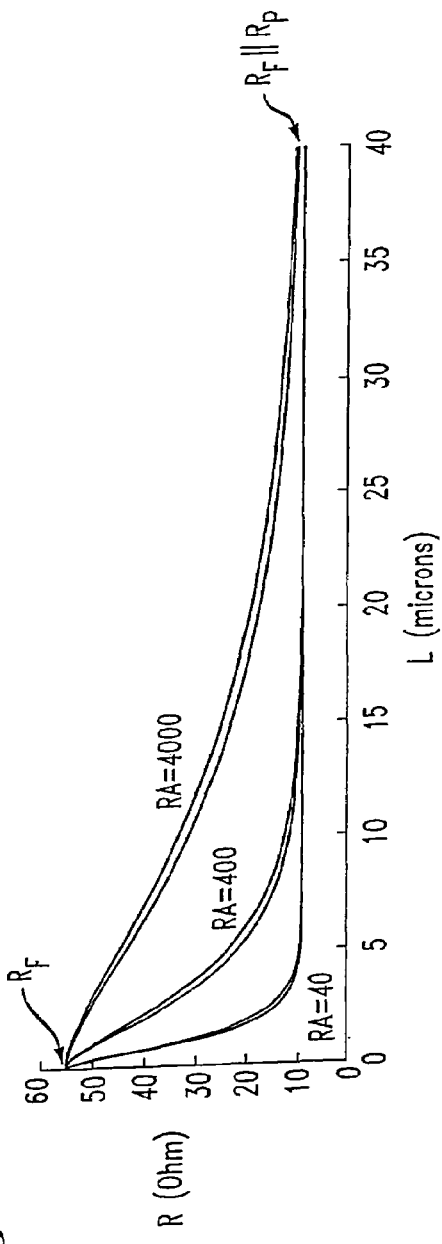

FIGS. 6A and 6B show the same plots as 5A and 5B, respectively, only the plotted curves are for four-point probes having evenly spaced probes. The space between each probe is illustrated as one-third of the total width of the probes, L (see FIG. 10B for an example of such a four-point probe). As can be seen, the shape of the curves is related to the RA product of the tunnel junction stack. Tunnel junction stacks with small RA values require very small probe spacings in order to determine relevant data. Even relatively large RA products, such as the RA product of 4000 Ohm-micron$^2$ require probe spacings on the order of 50 microns or less, or no in-plane MR and very little resistance change will be measured. The length scale for the RA products of 40, 400, and 4000 Ohm-micron$^2$ are 0.37, 1.15, and 3.65 microns, respectively.

It should be noted that the curves in FIG. 6 show the measured resistance, R. To calculate the resistance per square, Rsq, the following may be used:

$R_{sq} = R \times \pi / \ln(2)$, or $R_{sq} = R \times 4.53$.

$R_F$ and $R_P$ are examples of Rsq.

Based on FIGS. 6A and 6B, it is recommended that the spacings used vary from the smallest spacing possible out to around 10$\lambda$. Spacings greater than 10$\lambda$ may also be used, but values of in-plane MR and high and low resistances are stable after 10$\lambda$. It is also recommended that an estimate be made of the RA product of a stack prior to measurement, in order to ensure an appropriate range of spacings be selected for measurements. As shown in FIGS. 6A and 6B, the in-plane MR and resistance curves change depending on the RA product. The smallest possible spacing is chosen so that the limiting value of resistance at L=0 can be measured accurately. Importantly, the resistance at a zero spacing is $R_F$ for four-point probe configurations. Consequently, it is beneficial to get as close as possible to zero spacing. The largest spacing of 10λ is chosen so that the resistances will be stable at 10λ. For instance, for the RA products of 40, 400, and 4000 Ohm-micron$^2$, then 10λ is 3.7, 11.5, and 36.5 microns, respectively. Thus, 10λ provides stable values of resistances and also provides a margin for error in case the actual RA product is greater than the estimated RA product. The resistance curves will asymptotically approach the value of $R_F\|R_P$, and a probe spacing of 10λ should yield a value very close to the value of $R_F\|R_P$.

Thus, FIGS. 5A, 5B, 6A, and 6B show that, while it is possible to characterize tunnel junction film stacks by using probes or contact pads, choice of probe or contact pad spacing or spacings is critical. As stated previously, the conventional wisdom was that one could not characterize tunnel junction stacks using probes or contact pads, and this convention wisdom was borne out by measurements with widely spaced probes that showed no or very little measured in-plane MR.

Nonetheless, these figures also show that characterization of tunnel junction stacks may be made easily and with little or no processing, as long as the choice of probe or contact pad spacing or spacings is correctly chosen.

Exemplary Theory and Method

The graphs in FIGS. 5A, 5B, 6A, and 6B are determined from theory. This theory explains how current flows through the stack, and the equations from the theory depend on configurations of the probes and contact pads. Common probe and contact pad configurations are described below.

Theory for Cylindrical Symmetry

Consider the case of cylindrical symmetry (for example, assume a single point source of current at the origin). The equations are as follows:

$$\int \vec{J} \cdot \vec{dA} = I_0 \delta_0. \tag{1}$$

$$\int \vec{E} \cdot \vec{dl} = \int \rho \vec{J} \cdot \vec{dl} = 0. \tag{2}$$

Equation (1) gives $$J_z + \frac{\partial J_F}{\partial r} t_F + \frac{J_F}{r} t_F = 0,$$

and $$2\pi r(J_F t_F + J_P t_P) = I_0.$$

Equation (2) gives $$J_{FpF} - J_{ppp} + \frac{\partial J_z}{\partial r} RA = 0.$$

Combining these three equations gives the following differential equation:

$$f'' + \frac{1}{z}f' - \left(1 + \frac{1}{z^2}\right)f + \frac{\delta}{z} = 0,$$

where $f = E_F = \rho_F J_F,$ $z = r/\lambda,$ $$\delta \equiv \frac{R_F R_P}{R_F + R_P} \frac{I_0}{2\pi \lambda}, \text{ and } \lambda \equiv \left(\frac{RA}{R_F + R_P}\right)^{1/2}.$$

Luckily, an exact solution to this differential equation may be determined for different probe and contact pad configurations. A general solution is as follows:

$$f = AK_1(z) + BI_1(z) + \frac{\delta}{z},$$

where $K_1$ is a modified Bessel function of the second kind of order one, and $I_1$ is a modified Bessel function of the first kind of order one. Using this general solution and appropriate boundary conditions, the electric field can be solved for any situation involving cylindrical symmetry. The electric field is then integrated to calculate the voltage drop between any two points. The principle of superposition is used to superimpose more than one current source. For the specific case of one point current source at the origin, the boundary conditions are:

$$zf - z^2 f' = \frac{I_0 R_f}{\pi \lambda} \text{ as } z \to 0, \text{ and } f = 0 \text{ as } z \to \infty.$$

For the case of four equally spaced probes in a line, the solution is as follows:

$$R = \frac{V}{I} = \frac{R_F \| R_P}{\pi} \left\{ \frac{R_F}{R_P} \left[ K_0\left(\frac{L}{3\lambda}\right) - K_0\left(\frac{2L}{3\lambda}\right) \right] + \ln(2) \right\},$$

where L is the distance between the first and last probes, $$R_F \| R_p = \frac{R_F R_p}{R_F + R_p},$$

and $K_0$ is a modified Bessel function of the second kind of order zero.

Consider the case of four probes in a straight line in the order of I$^+$, V$^+$, V$^-$, and I$^-$, where spacings between the probes are as follows: a, which corresponds to the spacing between I$^+$ and V$^+$; b, which corresponds to the spacing between V$^+$ and V$^-$; and c, which corresponds to the spacing between V$^-$ and I$^-$. For this situation, the solution is as follows:

$$R = \frac{R_F \| R_P}{2\pi} \left\{ \frac{R_F}{R_P} \left[ K_0\left(\frac{a}{\lambda}\right) + K_0\left(\frac{c}{\lambda}\right) - K_0\left(\frac{a+b}{\lambda}\right) - K_0\left(\frac{b+c}{\lambda}\right) \right] + \ln\left[\frac{(a+b)(c+b)}{ac}\right] \right\}.$$

Consider the case of four probes placed arbitrarily on the surface of a wafer (not necessarily in a straight line), where spacings between the probes are as follows: a, which corresponds to the spacing between I$^+$ and V$^+$; b, which corresponds to the spacing between I$^+$ and V$^-$; c, which corresponds to the spacing between V$^+$ and I$^-$; and; d, which corresponds to the spacing between V$^-$ and I$^-$. For this situation, the solution is as follows:

$$R = \frac{R_F \| R_P}{2\pi} \left\{ \frac{R_F}{R_P} \left[ K_0\left(\frac{a}{\lambda}\right) + K_0\left(\frac{d}{\lambda}\right) - K_0\left(\frac{c}{\lambda}\right) \right] + \ln\left[\frac{bc}{ad}\right] \right\}.$$

Linear Symmetry

As a second example, consider the case of linear symmetry (for example, FIGS. 4A and 4B). Using Equations (1) and (2) now results in the following differential equation:

$f''-f+\delta=0.$

With definitions:

$$\delta \equiv \frac{R_F R_P}{R_F + R_P} \frac{I_0}{W}, \text{ and } z \equiv x/\lambda,$$

the general solution is now the following:

$f=Ae^z+Be^{-z}+\delta.$

For the specific case shown in FIGS. 4A and 4B the solution is the following:

$$R \equiv R_F \| R_P \frac{L}{W} \left[ 1 + 4\left(\frac{\lambda}{L}\right)\left(\frac{R_F}{R_P}\right)\left(\frac{\sinh^2(L/2\lambda)}{\sinh(L/\lambda)}\right) \right].$$

Note that this assumes the limits of X→0 and W→∞. In other words, the pads have no length and are infinitely wide (i.e., W>>L>>X).

Now that the theory has been explained for a variety of probe and contact pad configurations, it will now be shown how to use this theory in order to characterize tunnel junction film stacks.

Figure 7:
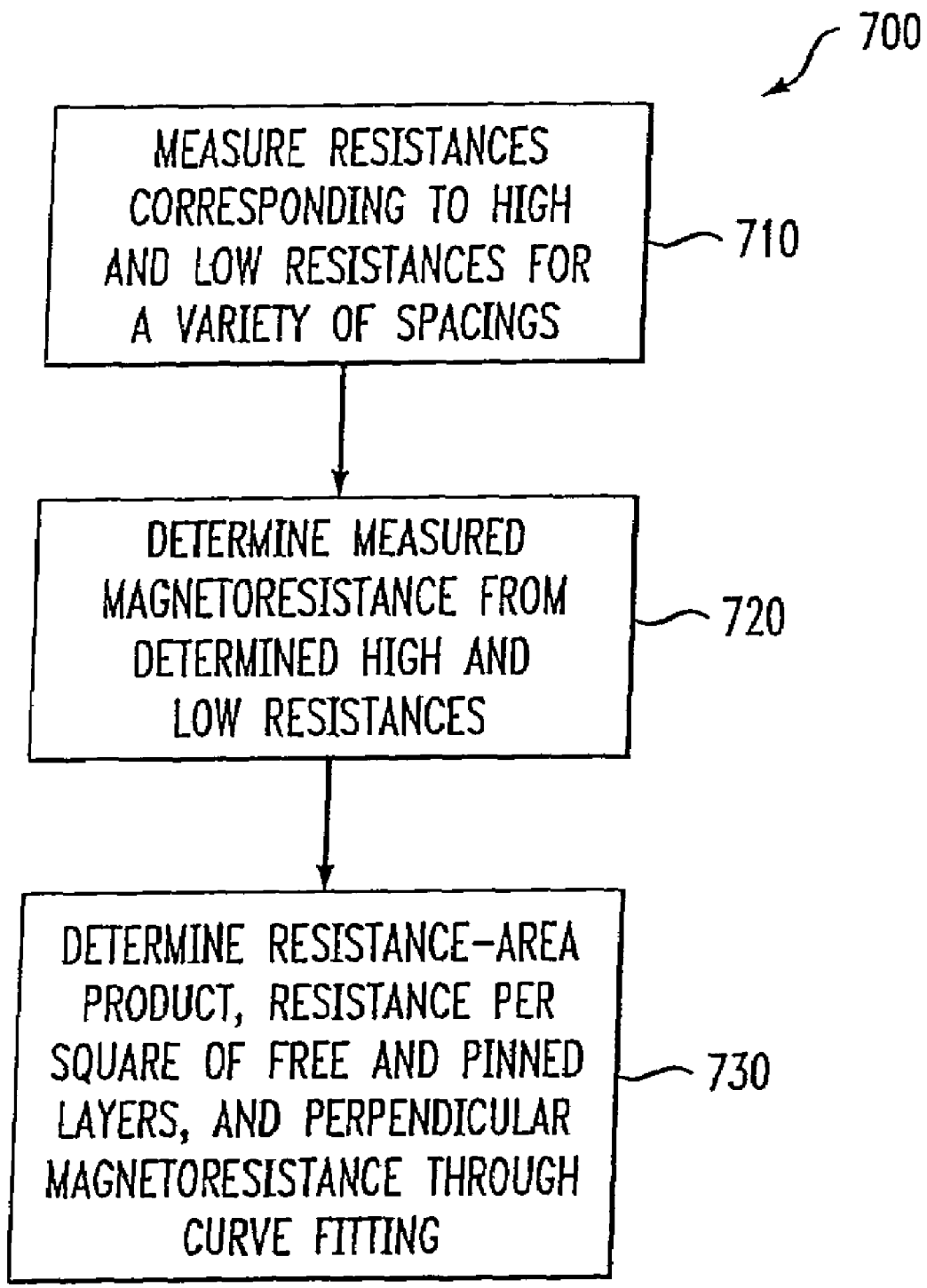
FIG. 7 is a method for characterizing tunnel junction films in accordance with one embodiment of the present invention.

Referring now to FIG. 7, a method 700 is shown for characterizing tunnel junction film stacks. Method 700 assumes that processing, if any is necessary, has been performed. For instance, if a number of two-point contact pads are going to be used to determine quantities associated with the tunnel junction film stacks, then the processing necessary to create the contact pads should be performed prior to starting method 700. Such processing is well known to those skilled in the art and is described in more detail below with respect to various contact pads. Additionally, other steps such as annealing should be performed if necessary. Note that the term "probe" as used herein encompasses any electrical connections between a contact pad and a current supply or a voltage measuring device.

Method 700 begins in step 710, when a number of resistances are measured for the high and low resistances. The high and low resistances are caused by first and second magnetizations of the free layer (or other layer able to change magnetizations) of the stack. These resistances are measured for a variety of probe or contact pad spacings. As explained above, it is beneficial to measure resistance by using spacings from the smallest possible spacing to about 40λ. The "spacing" that is important depends on the probe or contact pad configuration being used. For instance, for a four-point probe the spacing that is important is the average of the three distances between the four probes in the four-point probe. Regardless of the probe or contact pad configuration used, a number of probe spacings should be used in order to determine enough resistance data to adequately characterize the tunnel junction film stack.

There are a number of techniques for performing step 710. For instance, when using four-point probes, a selected four-point probe, having a selected spacing between probes, is placed in electrical contact with a surface of the stack (e.g., the surface of the free layer), then current is passed through two of the probes while the voltage is measured at another two of the probes. It should be noted that voltage could be applied to the stack and current measured. A magnetic field, suitable to switch magnetization of the free layer, is applied to the stack. Then the current is again passed through two of the probes while voltage is measured at another two of the probes. Another four-point probe, with different probe spacing, is selected and measurements are taken at both magnetizations of the free layer. This process is repeated until all spacings have been tested.

In one embodiment of the present invention, a multi-point probe is used. In a particular embodiment, the multi-point probe is a 12-point probe, although probes having higher or lower number of points are also useful. This 12-point probe is a micro-machined probe and there are a variety of spacings between the probes. Moreover, current and voltage can be routed to any four probes of the 12-point probe. Using the twelve-point probe, a large array of resistance data can be quickly determined. With this multi-probe, it is more efficient to determine resistance data for a variety of probe spacings, then apply a magnetic field to switch magnetization of the free layer, and again determine resistance data for a variety of probe spacings.

In step 710, measured in-plane MR is determined for each set of high and low resistances for each spacing. For instance, if a probe has a spacing of 10 microns between each of the probes in a four-point probe, a resultant high and low resistance can be determined for this 10 micron spacing. From the high and low resistances, a corresponding in-plane MR is determined for this 10 micron spacing.

In step 730, curve fitting is performed. The RA product, $R_F$, $R_P$, and perpendicular MR are determined by using one set of determined resistances from either the high or low resistance data and by using a curve fitting technique. In other words, a mathematical equation has already been determined for the particular configuration of probes or contact pads. Fitting is performed by assuming values for the RA product, $R_F$, $R_P$, and perpendicular MR and then calculating in-plane MR and resistance curves. The values of the in-plane MR and resistance curves are then compared with the calculated values of in-plane MR and resistance curves. This process is then iterated, each time changing values for the RA product, $R_F$, $R_P$, and perpendicular MR, until the best agreement between the measured and calculated values of in-plane MR and resistance is obtained.

Thus, method 700 allows perpendicular MR, the RA product, $R_F$, and $R_P$ to be determined with little or no processing, in contrast to conventional techniques, which required lengthy processing.

It should be noted that the "curves" described above should be broadly construed. For instance, a 12-point probe is described below that allows various spacings to be used during measurements. Because the spaces are not evenly chosen, all of the resultant in-plane MR and resistance data cannot be shown on a graph having two axis. Nonetheless, curve fitting techniques and theoretically derived equations are available to fit the equations with the data.

Advantageously, steps 710 and 720 of method 700 shown in FIG. 7 may also be used to measure the hysteresis curve shown in FIG. 2. For instance, resistance could be measured as a function of applied magnetic field using a four point probe on the surface of an unpatterned tunnel junction film stack, where the smallest spacing between any two of the probes used during the measurements is less than 100 microns. The entire hysteresis curve of FIG. 2 could easily be measured using the apparatus and methods disclosed herein. It is beneficial to use spacing that is close to the length scale for the tunnel junction film stack.

Figure 8A:
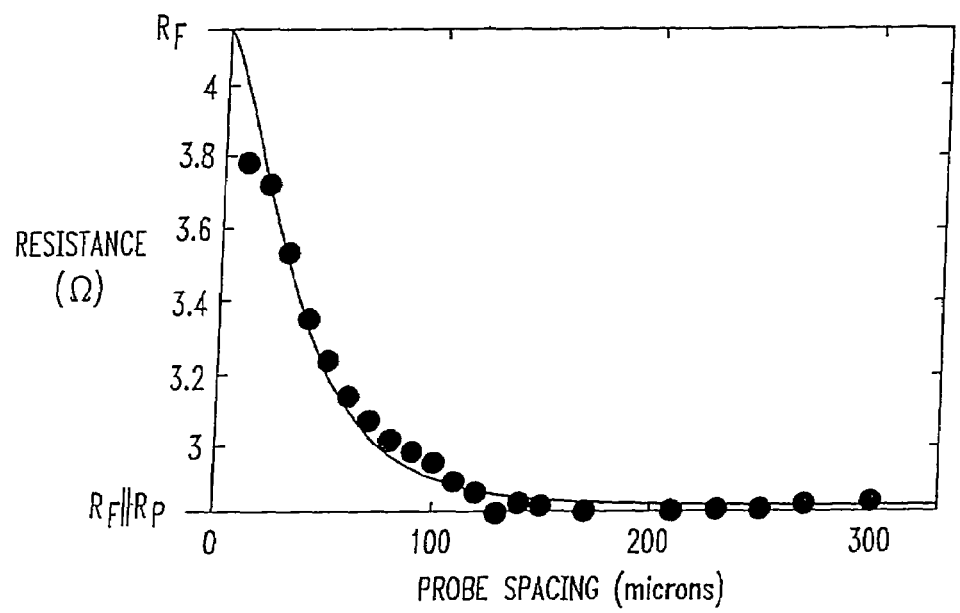
FIGS. 8A and 8B are graphs of measured resistance and MR, respectively, and curves fitting the measured data, for lithographically defined four point contact pads of FIG. 12, in accordance with one embodiment of the present invention.
Figure 8B:
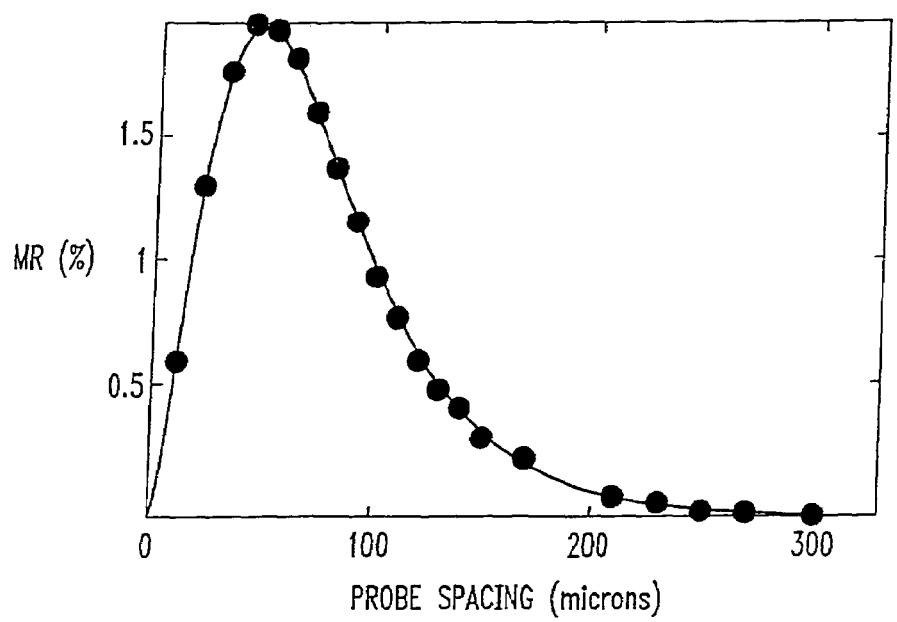
Figure 12:
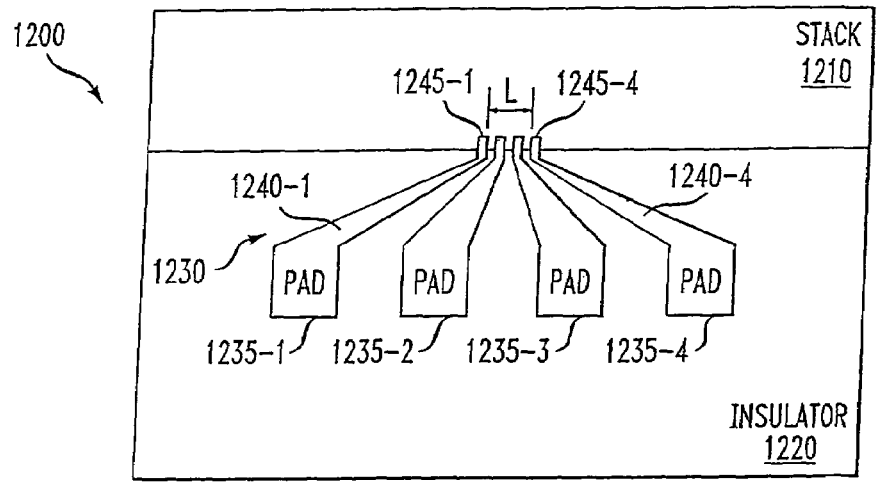
FIGS. 12, 13, and 14 illustrate lithographically defined contact pads suitable for use with the present invention, in accordance with embodiments of the present invention.

Turning now to FIGS. 8A and 8B, two curves are shown for a variety of probe spacings for a number of lithographically defined four-point contact pads (see FIG. 12). In FIG. 8A, a low resistance curve is shown. The dots indicate determined resistances, which were determined by using measured voltages and predetermined currents at a variety of probe spacings. The curve is the best fit by using the curve fitting techniques described in step 720 of the method 700 of FIG. 7. For this geometry, the highest resistance point on the curve is equivalent to the resistance per square of the free layer, $R_F$. The lowest resistance point on the curve is the parallel combination of the resistances per square of the free and pinned layers, or $R_F \| R_P$.

FIG. 8B shows MR for a variety of probe spacings. The dots indicated MRs determined by using the high and low determined resistances at the probe spacings. The curve is the best fit determined through the techniques of method 750 of FIG. 7. It should be noted that the RA product is quite large in this example, being about 72,000 Ohm-micron$^2$.

Exemplary Apparatus

Figure 9:
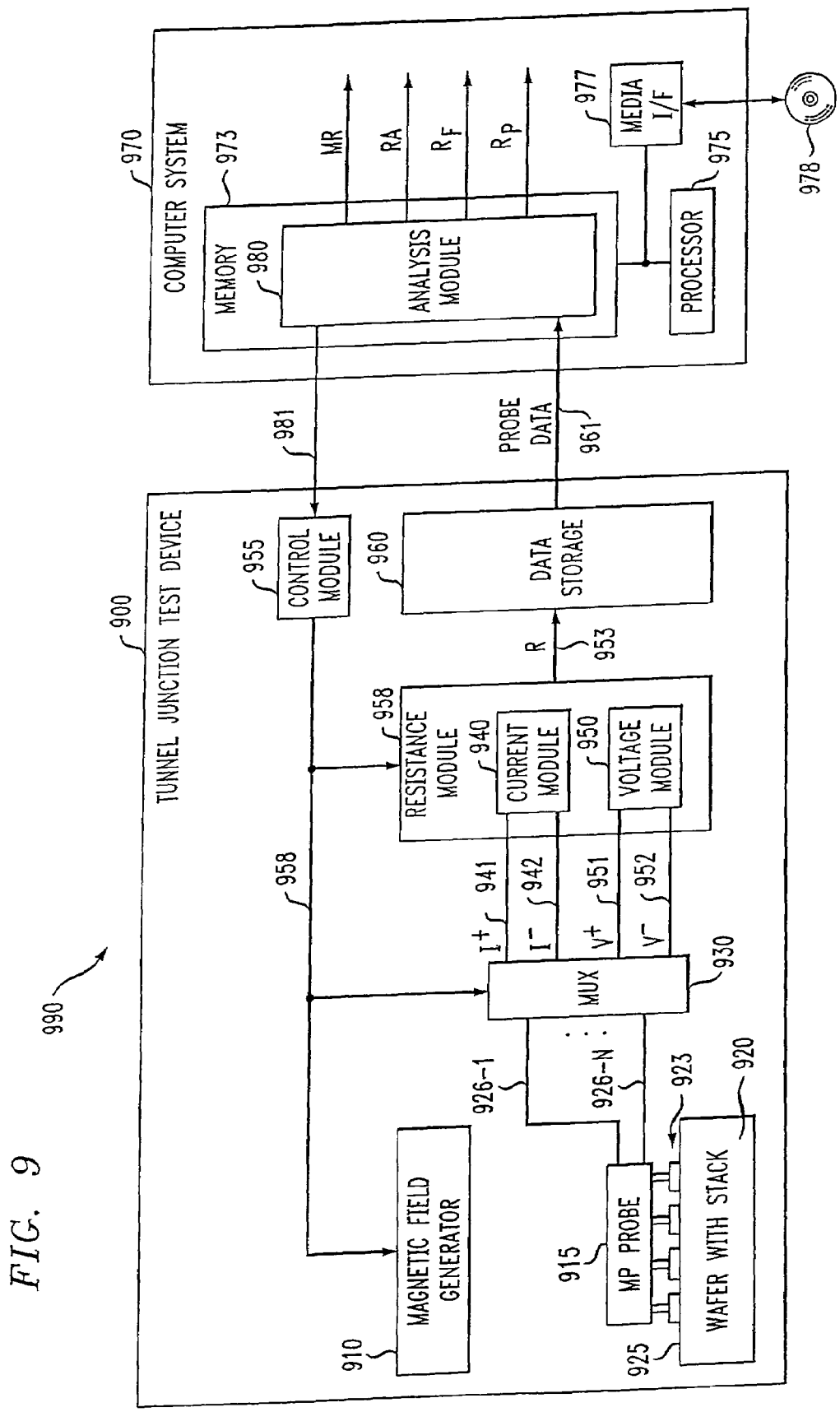
FIG. 9 is a block diagram of an apparatus for characterizing tunnel junction films in accordance with one embodiment of the present invention.

Referring now to FIG. 9, an exemplary apparatus 990 is shown that is suitable for characterizing tunnel junction film stacks in accordance with the present invention. Apparatus 990 comprises a tunnel junction test device 900 and a computer system 970, which interact through optional probe data connection 961 and control connection 981. Tunnel junction test device 900 is beneficially a scanning conductivity microscope and is made by Capres of Denmark. Tunnel junction test device 900 is shown testing a semiconductor wafer 920 with a tunnel junction film stack formed thereon. Beneficially, no processing of the semiconductor wafer 920 is performed, so no contact pads 923 will be present on semiconductor wafer 920. However, some embodiments of the present invention use optional contact pads 923 formed on the stack of the semiconductor wafer 920. Thus, FIG. 9 shows optional contact pads 923. It should be noted that the semiconductor wafer 920 and contact pads 923 are not part of the tunnel junction test device 900.

The tunnel junction test device 900 comprises a magnetic field generator 910, multi-point probe 915, multiplexer 930, resistance module 958, control module 955, and data storage module 960. Resistance module 958 comprises a current module 940 and a voltage module 950. Current module 940 measures current, such that the current module 940 produces or determines or both a current to within a particular accuracy. Voltage module 950 measures voltage, such that the voltage module 950 produces or determines or both a voltage to within a particular accuracy. Similarly, The connections 926-1 through 926-N (collectively, "connections" 926) connect the multi-point probe 915 and the multiplexer 930. Current module 940 is coupled to multiplexer 930 through current lines 941 and 942. The voltage module 950 is similarly coupled to the multiplexer 930 through voltage lines 951 and 952. Connection 953 is an optional connection used to communicate the measured resistance to data storage 960, if used.

Computer system 970 comprises memory 973 having an analysis module 980, a processor 975, and a media interface 977. Computer system 970 is shown interacting with a Digital Versatile Disk (DVD) 978 through media interface 977. Analysis module 980 performs the method 700 of FIG. 7 to determine perpendicular MR, the RA product, and the resistances per square of $R_F$ and $R_P$. Resistance data may be extracted from data storage 960 through probe data connection 961 in certain configurations of apparatus 990. Analysis module 980 can also be used, through control connection 981, to modify control module 955 in order to select currents used by current module 940 or voltages used by voltage module 950, and to determine how current connections 941, 942 and voltage connections 951, 951 are routed through multiplexer 930, if used. Additionally, control module 955 may be set to turn on and off magnetic field generator 910 and to, optionally, select an appropriate magnetic field for magnetic field generator 910. Optionally, programming can be performed directly through the tunnel junction test device 900 through control module 955. Additionally, computer system 970 may be entirely contained in tunnel junction test device 900, if desired.

Advantageously, the smallest spacing between any two of the multiple probes on multi-point probe 915 used during a resistance measurement has a spacing of 100 microns or less. In other words, multi-point probe 915 comprises four or more probes. Two of the probes used during a resistance measurement will have the smallest spacing of the four probes being used during a resistance measurement. In order to characterize a large number of tunnel junction film stacks of different materials, this smallest spacing is beneficially 100 microns or less.

As is known in the art, the methods and apparatus discussed herein may be distributed as an article of manufacture that itself comprises a computer-readable medium having computer-readable code means embodied thereon. The computer-readable program code means is operable, in conjunction with a computer system such as computer system 970, to carry out all or some of the steps to perform the methods or create the apparatuses discussed herein. The computer-readable medium may be a recordable medium (e.g., floppy disks, hard drives, compact disks, DVD 978, or memory cards) or may be a transmission medium (e.g., a network comprising fiber-optics, the world-wide web, cables, or a wireless channel using time-division multiple access, code-division multiple access, or other radio-frequency channel). Any medium known or developed that can store information suitable for use with a computer system may be used. The computer-readable code means is any mechanism for allowing a computer to read instructions and data, such as magnetic variations on a magnetic medium or height variations on the surface of an optical disk, such as DVD 978.

Memory 973 configures the processor 975 to implement the methods, steps, and functions disclosed herein. The memory 973 could be distributed or local and the processor 975 could be distributed or singular. The memory 973 could be implemented as an electrical, magnetic or optical memory, or any combination of these or other types of storage devices. Moreover, the term "memory" should be construed broadly enough to encompass any information able to be read from or written to an address in the addressable space accessed by processor 973. With this definition, information on a network (not shown) is still within memory 973 because the processor 975 can retrieve the information from the network. It should be noted that each distributed processor that makes up processor 973 generally contains its own addressable memory space. It should also be noted that some or all of computer system 970 can be incorporated into an application-specific or general-use integrated circuit.

It should be noted that a tunnel junction test device 900 will generally comprise additional devices that are not shown. For example, because the probes and contact pads are usually very small, some type of magnification is beneficial. This magnification may be provided by a Charge-Coupled Device (CCD). Additionally, a mounting system is generally used to mount the multi-point probe 915 and semiconductor wafer 920 and to move each relative to the other (or to keep the semiconductor wafer 920 fixed and move the multi-point probe 915, for instance). Specifically, a mechanism for positioning probes can use a laser beam that reflects off the bottom of the semiconductor wafer 920. It is also beneficial to be able to measure multiple locations on the semiconductor wafer 920, in order to determine uniformity of the stack and its associated layers.

Figure 13:
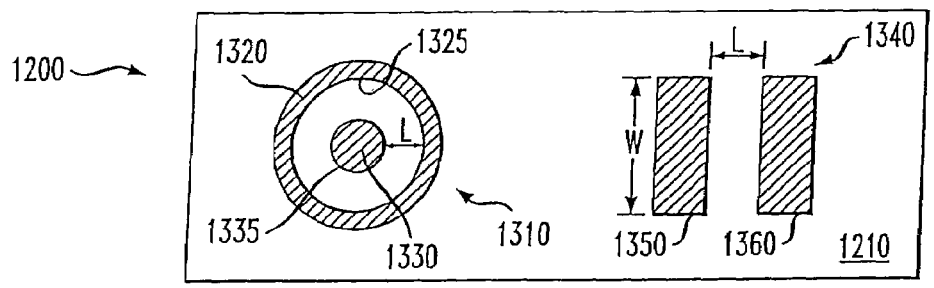
Figure 14:
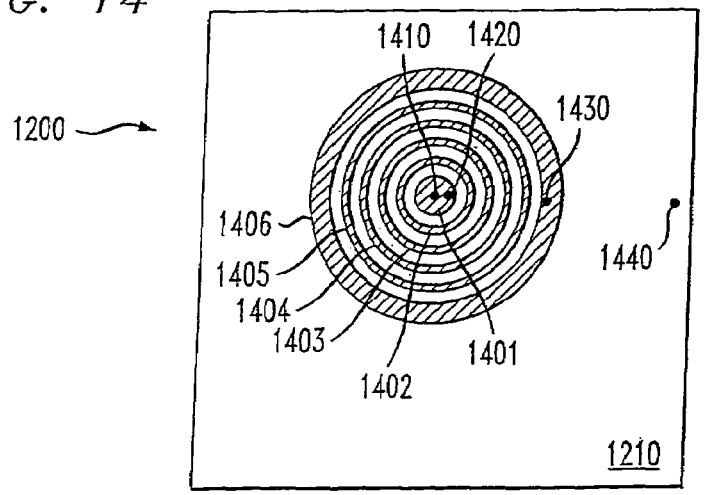

Various configurations of apparatus 990 will now be described in reference to different probes and contact pads. FIGS. 10 and 11 are directed to exemplary probes, and FIGS. 12 through 14 are directed to contact pads. Reference should be made, when appropriate, to FIG. 9.

Figure 10A:
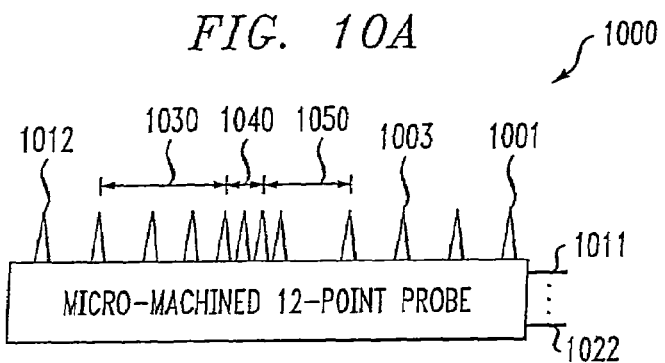
FIGS. 10A and 10B are micro-machined probes for use in the apparatus of FIG. 9, in accordance with one embodiment of the present invention.
Figure 11:
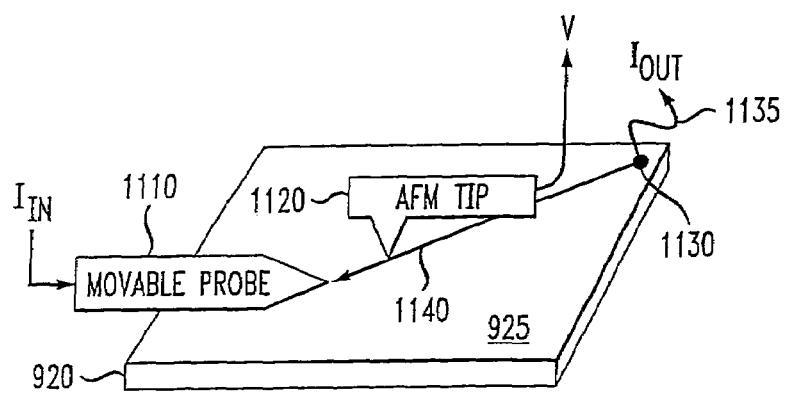
FIG. 11 is a diagram of an Atomic Force Microscope (AFM), a movable probe, and a contact pad, in accordance with one embodiment of the present invention.

FIG. 10A shows a micro-machined 12-point probe having twelve connections 1011 through 1022, of which connections 1011 and 1022 are shown, and twelve individual probes 1001 through 1012, of which probes 1001, 1003, and 1012 are labeled. The probes 1001 through 1012 have known spacings. Each probe 1001 through 1012 is connected to one of the connections 1011 through 1022, which are then coupled to connections 926-1 through 926-N. Control module 955 is set to select current for current module 940 and its connections 941, 942 and to cause the multiplexer 930 to route these connections to two of the probes 1001 through 1012. Additionally, control module 955 directs multiplexer 930 to connect connections 951, 952 from voltage module 950 to another two of the probes 1001 through 1012. Furthermore, it is also possible that voltage module 950 is used to create a voltage and current module 940 is used to measure a resulting current. In the example of FIG. 10A, probes 1011, 1008, 1006, and 1004 are selected by multiplexer 930, so that probe 1011 is coupled to connection 941, probe 1008 is coupled to connection 951, probe 1006 is coupled to connection 952, and probe 1004 is coupled to connection 942. The spacings between these probes are spacings 1030, 1040, and 1050, respectively. Thus, the equation given above for a four-point probe having unequal spacings between the probes is used.

The largest and smallest spacings between selected probes are chosen to be within a predetermined amount from the expected length scale, $\lambda$, based on the expected RA product, $R_F$ and $R_P$. The spacing which is used to determine the predetermined amount is an average of the three spacings between the four selected probes. Because the micro-machined probe 1000 is formed through known semiconductor micro-machining techniques, generally the smallest possible spacing that can be made will be used in order to come as close as possible to determining $R_F$. Currently, spacings suitable to measure an RA product of 200 Ohm-micron$^2$ have been created, which is a spacing as small as 1.5 microns, depending on $R_F$ and $R_P$. Advantageously, the smallest spacing between two of the plurality of probes used during a resistant measurement is a spacing of approximately 100 microns or less, as this provides suitable spacings to measure tunnel junction stack films with a wide variety of RA products, and resistances per square. In the example of FIG. 10A, the smallest spacing for probes being used for a single resistance measurement is illustrated by reference numeral 1040.

Probes 1001 through 1012 are placed in physical contact with the surface 925 of semiconductor wafer 920 (in this example, contact pads 923 are not used), which also provides an electrical connection between the probes 1001 through 1012 and the stack on the semiconductor wafer 920. The magnetization of the stack is set in a first magnetization by using the magnetic field generator 910. Control module 955 selects appropriate probes 1001 through 1012 in order to route current and voltage through four probes of the 12-point probe 1000, and control module 955 controls resistant module 958 so that an appropriate resistance is measured. This process is repeated for a predetermined number of combinations of probes 1001 through 1012. Resultant resistance data is stored in data storage 960. Then magnetic field generator 910 is turned on by the control module 955, and the process of selecting four of the probes 1001 through 1012 of 12-point probe 1000 is repeated. The resultant resistance data 953 is stored in data storage 960. The analysis module 980 then retrieves the probe data 961 and analyzes the data to create the perpendicular MR, the RA product, and the resistances $R_F$ and $R_P$.

Using the micro-machined 12-point probe 1000 in tunnel junction test device 900 provides very fast voltage determination times with no required stack processing.

Figure 10B:
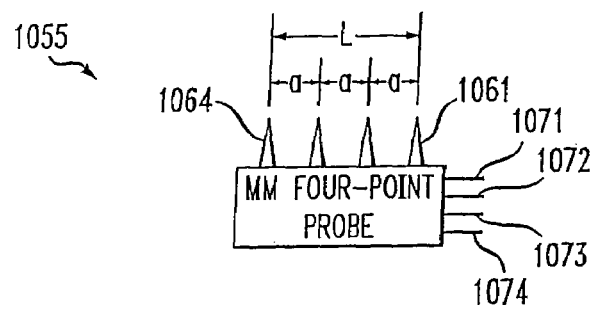

Referring now to FIG. 10B, another micro-machined probe is shown. In this micro-machined four-point probe 1055, there are four connections 1071 through 1074 and four evenly spaced (spaced by a) probes 1061 through 1064, of which probes 1061 and 1064 are labeled. In this configuration, multiplexer 930 is not required but may be used. Assume that connection 1071 is coupled to probe 1061, connection 1072 is coupled to probe 1062, connection 1073 is coupled to probe 1063, connection 1074 is coupled to probe 1064. Then, connections 1071 through 1074 are generally directly connected to appropriate voltage and current connections in the following manner: connection 1074 is coupled to current connection 941; connection 1073 is coupled to voltage connection 1951; connection 1072 is coupled to voltage connection 952, and connection 1071 is coupled to current connection 942.

The four-point probe 1055 is used similarly to the 12-point probe 1000. The four-point probe 1055 is placed in contact with the surface 925 of semiconductor wafer 920. Current is passed through probes 1061 and 1064 and voltage is measured by using probes 1062 and 1063. Alternatively, voltage is placed on probes 1062 and 1063 and current is measured from probes 1061 and 1064. The magnetic field generator 910 is turned on, which switches the magnetization of the free layer in the stack. A measurement of resistance is then performed. Because the four-point probe 1055 is designed for one spacing, multiple four-point probes 1055 with multiple spacings need to be used to provide meaningful data in order for analysis module 980 to characterize tunnel junction quantities. The spacings are provided from as small as possible to a predetermined distance from $\lambda$. The space a is used to determine the predetermined distance. Generally, each four-point probe is manually placed in contact with the semiconductor wafer 920. It is beneficial that the smallest spacing between two of the plurality of probes used during a resistant measurement is a spacing of approximately 100 microns or less.

Referring now to FIG. 11, another configuration using multi-point probe 915 is shown. This configuration uses an Atomic Force Microscope (AFM), which is a well known device. In this configuration, one probe is a movable probe 1110, which is placed in contact with surface 925 of semiconductor wafer 920. Another of the probes is contact 1130 and its associated wire 1135. Contact 1130 is formed through known techniques. As such, there is some required processing of the semiconductor wafer 920, but the amount of processing is small. Current is injected by movable probe 1110, and removed at contact 1130. Another probe is the Atomic Force Microscope (AFM) tip 1120, which is used to measure voltage. The AFM tip 1120 is passed along path 1140, ending as close as possible to movable probe 1110.

The equations for the configuration of FIG. 11 can be derived straightforwardly from the cylindrical symmetry case described above.

Turning now to FIG. 12, one exemplary set of lithographically defined contact pads 1230 are shown. Stack 1210 is formed on semiconductor wafer 1200. The stack 1210 is formed over the entire semiconductor wafer 1210, in this example. Processing is performed to form an insulating layer 1220 over the stack 1210. Insulating layer 1220 could be $SiO_2$ or hard-baked photoresist. For instance, photoresist could be deposited and patterned, then hard baked to form insulating layer 1220. Over the insulating layer 1220 is formed a set of metal pads 1235-1 through 1235-4 (collectively, "pads 1235"), corresponding runs 1240-1 through 1240-4 (collectively, "runs 1240"), and corresponding tips 1245-1 through 1245-4 (collectively, "tips 1245"). The tips 1245 are formed to overlap the stack 1210 and are formed to be in physical and electrical contact with the stack 1210. Conventional techniques are used to form the four-point contact pads 1230. For instance, another layer of photoresist is formed and patterned to create the four-point contact pads 1230. Then metal is deposited and the photoresist is removed through wet etch.

Generally, a conventional four-point probe is used to physically contact the pads 1235 of four-point contact pads 1230. Generally, the multiplexer 930 will not be used and, instead a four-point probe is connected to the pads 1235. Current is passed through pads 1235-1 and 1235-4 and voltage is measured across pads 1235-2 and 1235-4. Multiple different four-point contact pads 1230 will be formed during processing, each with different spacing L. Data from each of these contact pads 1230 will be used to characterize the stack 1210. FIGS. 8A and 8B were created from four-point contact pads formed in this manner.

Similarly, the other configurations shown in FIGS. 13 and 14 will be made with multiple spacings and data therefrom will be used to characterize the stack 1210. In the configurations shown in FIGS. 12 through 14, four- or two-point probes may be used to contact the contact pads. Alternatively, other devices may be used to contact the contact pads. For instance, contacts could be formed on the contact pads and wires connected to the contacts. Such contacts and wires are defined herein as probes.

Referring now to FIG. 13, two two-point contact pads 1310 and 1340 are shown. Two-point contact pad 1310 comprises inner circular pad 1335 and outer annulus pad 1320. The spacing, L, is between the outer circumference 1335 of contact pad 1310 and inner surface 1325 of annulus pad 1325. The appropriate equation for this configuration is easily derivable from the "cylindrical theory" equation presented above. The two-point contact pad 1340 comprises two pads 1350 and 1360, separated by spacing, L, and having width, W. Theoretical resistance and in-plane MR curves for the two-point contact pad 1340 have been described above in reference to FIGS. 5A and 5B.

Referring now to FIG. 14, a final contact pad configuration is shown. In this configuration, a center circular pad 1401 is surrounded by a number of annuluses 1402 through 1406. Locations 1410, 1420, 1430, and 1440 are examples of where probes would be placed. The distances between the annuluses are the spacings used to determine how far from the length scale, $\lambda$, the spacings are. This configuration may help with specific cases involving low RA product tunnel junction film stacks. The equations for this configuration are derivable from the "cylindrical theory" presented above.

It should be noted that the stack shown in the preceding figures may be much more complex than that described. In particular, many such stacks have free and pinned layers are themselves made of many layers. Additionally, the free and pinned layers may be reversed, such that the free layer is on top of the substrate and the pinned layer then is used to perform characterization measurements. There are also materials having more than two magnetizations, and tunnel junction film stacks where the electrodes (i.e., the layers above and below the tunnel junction barrier) are nonmagnetic and the tunnel junction barrier is magnetic. Moreover, there are tunnel junction film stacks having multiple tunnel junction barriers, free layers, and pinned layers. The present invention can be used with any tunnel junction stack films.

It is to be understood that the embodiments and variations shown and described herein are merely illustrative of the principles of this invention and that various modifications may be implemented by those skilled in the art without departing from the scope and spirit of the invention.

What is claimed is:

1. A semiconductor wafer used to characterize a tunnel junction film stacks, comprising:

a tunnel junction film stack formed on a substrate, wherein the tunnel junction film stack comprises a free layer, a tunnel barrier and a pinned layer and wherein the layers of the formed tunnel junction film stack are not etched; and a plurality of sets formed on a surface of the tunnel junction film stack, each of the sets having a plurality of pads, each of the sets having a spacing between pads.

2. The semiconductor wafer of claim 1, wherein each of the sets comprise circular contact pad surrounded by a plurality of annuluses.

3. The semiconductor wafer of claim 2, wherein a smallest spacing between two of the annuluses on each of the sets is less than 100 microns.

* * * * *

UNITED STATES PATENT AND TRADEMARK OFFICE
CERTIFICATE OF CORRECTION

PATENT NO.        : 7,622,735 B2                                Page 1 of 1
APPLICATION NO.   : 11/119665
DATED             : November 24, 2009
INVENTOR(S)       : Daniel Christopher Worledge It is certified that error appears in the above-identified patent and that said Letters Patent is hereby corrected as shown below:

On the title page item [73] should read
     -- Infineon Technologies North America Corp., San Jose, CA --

Signed and Sealed this
Sixteenth Day of July, 2013

Teresa Stanek Rea
*Acting Director of the United States Patent and Trademark Office*